(12) United States Patent
Aoki et al.

(10) Patent No.: US 8,478,929 B2
(45) Date of Patent: Jul. 2, 2013

(54) DATA PROCESSING SEMICONDUCTOR DEVICE

(75) Inventors: Yasunobu Aoki, Kanagawa (JP); Hideo Kasai, Kanagawa (JP); Masamichi Fujito, Kanagawa (JP); Junpei Inoue, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 383 days.

(21) Appl. No.: 12/964,803

(22) Filed: Dec. 10, 2010

(65) Prior Publication Data

US 2011/0145521 A1 Jun. 16, 2011

(30) Foreign Application Priority Data

Dec. 11, 2009 (JP) ................... 2009-281287

(51) Int. Cl.
*G06F 12/00* (2006.01)
(52) U.S. Cl.
USPC ........................................... 711/103

(58) Field of Classification Search
None
See application file for complete search history.

(56) References Cited

U.S. PATENT DOCUMENTS

2010/0329026 A1* 12/2010 Nakamura et al. ....... 365/185.21

FOREIGN PATENT DOCUMENTS

JP 2002-367382 A 12/2002

* cited by examiner

*Primary Examiner* — Brian Peugh
(74) *Attorney, Agent, or Firm* — Miles & Stockbridge P.C.

(57) ABSTRACT

To improve the reliability of controlling overwriting of a nonvolatile memory in a data processing semiconductor device.
In a data processing semiconductor device, a control unit which controls reading, writing, or erasing of data in a rewritable nonvolatile memory area has an operation mode that, referring to the input temperature data, controls a temperature range in which writing or erasing of data is performed to be narrower than the temperature range that allows reading of data in the memory area.

18 Claims, 16 Drawing Sheets

FIG. 4

| TEMPERATURE SENSOR INFORMATION | Flash OPERATION RECEPTION | | | FORCED WRITING PERMISSION |
|---|---|---|---|---|
| | READING | WRITING | ERASING | |
| ~160°C | ○ | ○ | ○ | ○ |
| ~175°C | ○ | × | × | ○ |

| TEMPERATURE SENSOR INFORMATION | COMMON TO ENTIRE MEMORY AREA | CODE MEMORY AREA 901 | | DATA MEMORY AREA 902 | | FORCED WRITING PERMISSION |
|---|---|---|---|---|---|---|
| | READING | WRITING | ERASING | WRITING | ERASING | |
| -40°C ~ | ○ | × | × | ○ | ○ | ○ |
| -10°C ~ | ○ | ○ | ○ | ○ | ○ | ○ |
| ~125°C | ○ | ○ | ○ | ○ | ○ | ○ |
| ~160°C | ○ | × | × | ○ | ○ | ○ |
| ~175°C | ○ | × | × | × | × | ○ |

FIG. 10(b)

| TEMPERATURE SENSOR INFORMATION | COMMON TO ENTIRE MEMORY AREA | CODE MEMORY AREA 901 | | DATA MEMORY AREA 902 | | FORCED WRITING PERMISSION |
|---|---|---|---|---|---|---|
| | READING | WRITING | ERASING | WRITING | ERASING | |
| -40°C ~ | ○ | ○ | × | ○ | × | ○ |
| -10°C ~ | ○ | ○ | ○ | ○ | ○ | ○ |
| ~125°C | ○ | ○ | ○ | ○ | ○ | ○ |
| ~160°C | ○ | × | ○ | × | ○ | ○ |
| ~175°C | ○ | × | × | × | × | ○ |

FIG. 10(c)

| TEMPERATURE SENSOR INFORMATION | COMMON TO ENTIRE MEMORY AREA | CODE MEMORY AREA 901 | | DATA MEMORY AREA 902 | | FORCED WRITING PERMISSION |
|---|---|---|---|---|---|---|
| | READING | WRITING | ERASING | WRITING | ERASING | |
| -40°C ~ | ○ | × | × | ○ | × | ○ |
| -10°C ~ | ○ | ○ | ○ | ○ | ○ | ○ |
| ~125°C | ○ | ○ | ○ | ○ | ○ | ○ |
| ~160°C | ○ | × | × | × | ○ | ○ |
| ~175°C | ○ | × | × | × | × | ○ |

DATA PROCESSING SEMICONDUCTOR DEVICE

CROSS-REFERENCE TO RELATED APPLICATION

The disclosure of Japanese Patent Application No. 2009-281287 filed on Dec. 11, 2009 including the specification, drawings and abstract is incorporated herein by reference in its entirety.

BACKGROUND OF THE INVENTION

The present invention relates to a data processing semiconductor device, and particularly to a technology that can be effectively applied to a data processing semiconductor device having a built-in rewritable nonvolatile memory.

Recently, microcomputer products having rewritable nonvolatile memories mounted thereon for use in controlling car engines or the like are required to operate at higher temperatures. However, since repeated overwriting in an ultra-high temperature environment may degrade the retention property of flash memories mounted on microcomputers as rewritable nonvolatile memories, thereby failing to perform normal writing or erasing, it is necessary to limit overwriting at a high temperature.

As prior art, Japanese Patent Laid-Open No. 2002-367382 (Patent Document 1) discloses the technology of improving the reliability when reading data, based on reduced margin of the guaranteed voltage due to temperature variation.

The method described in Patent Document 1 attempts to improve data reliability by detecting the temperature of a semiconductor integrated circuit having a flash ROM (Read Only Memory) mounted thereon and, based on the detected temperature, adjusting the pulse width or voltage level of writing or erasing pulses applied to a memory cell when overwriting the flash ROM.

The inventors consider that the method described in the above-mentioned Patent Document 1 requires a large-scale control circuit for adjusting the pulse width and voltage level of writing or erasing pulses based on temperature. In addition, there is limitation in improving disturb resistance and retention property in an ultra-high temperature environment although writing or erasing is performed by the control.

The present invention has been made in view of the above circumstances and improves the reliability of controlling overwriting of a nonvolatile memory in a data processing semiconductor device.

The other purposes and the new feature of the present invention will become clear from the description of the present specification and the accompanying drawings.

SUMMARY OF THE INVENTION

The following explains briefly the outline of a typical invention among the inventions disclosed in the present application.

In a data processing semiconductor device, a control unit which controls reading, writing, or erasing of data in a rewritable nonvolatile memory area has an operation mode which, referring to input temperature data, controls the temperature range for writing or erasing data to be narrower than the temperature range that allows reading of data in the memory area.

The following explains briefly the effect acquired by the typical invention among the inventions disclosed in the present application.

The reliability of controlling writing or erasing a nonvolatile memory in a data processing semiconductor device is improved.

BRIEF DESCRIPTION OF THE DRAWINGS

FIG. 4 is a chart illustrating an exemplary control of data overwriting based on a predetermined temperature condition according to a P/E sequencer 12;

FIGS. 10(a) to 10(c) are charts each illustrating an exemplary method of controlling overwriting of data for each memory area by a P/E sequencer 90;

DETAILED DESCRIPTION OF THE PREFERRED EMBODIMENTS

1. Outline of Embodiments

Figure 1:
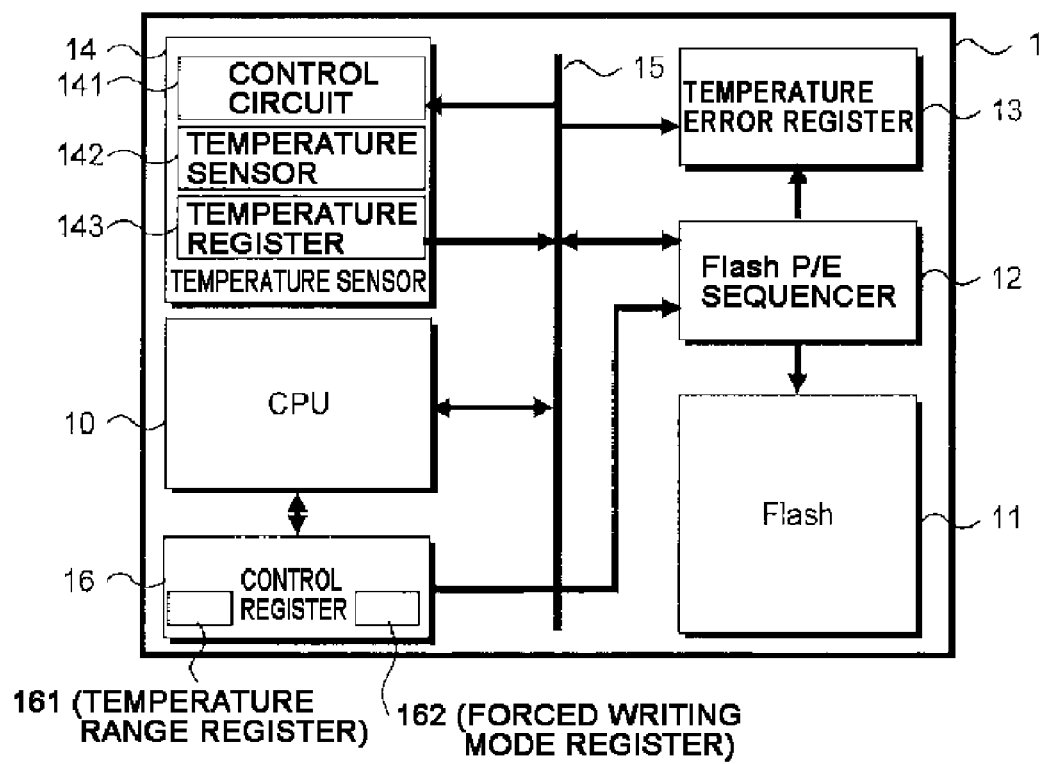
FIG. 1 is a chart illustrating a data processing semiconductor device according to an embodiment 1.

First, representative embodiments of the invention disclosed in this application are outlined. Reference numerals of the drawings which are referred to in parentheses in the outline explanation of the representative embodiments merely exemplify what are included in the concept of the components to which the numerals are provided.

[1] A data processing semiconductor device (1 to 6) according to a representative embodiment of the present invention comprises a nonvolatile memory unit (11, 91) having a rewritable nonvolatile memory area, and a control unit (12, 30, 90, 120, 160) which controls reading, writing, or erasing of data in the memory area. The control unit has a first operation mode which, referring to input temperature data, controls a temperature range for writing or erasing data to be narrower than a temperature range that allows reading of data in the memory area. Accordingly, writing at a high temperature is limited, thereby preventing degradation of retention property and deterioration of disturb resistance.

[2] In the data processing semiconductor device of aspect 1, the control unit writes or erases data in a second operation mode if the input temperature data indicates a temperature outside a temperature range for writing or erasing data in the first operation mode, and generates predetermined information for distinguishing the data from the data written or erased in the first operation mode. Accordingly, even if writing of data is performed at a high temperature, this written data can be distinguished from the data written in the first operation mode.

[3] In the data processing semiconductor device of aspect 2, the control unit reads data written in the second operation mode based on the predetermined information, and writes the read-out data in the first operation mode. Accordingly, the data which has been written at a temperature outside the temperature range is rewritten in the first operation mode, and whereby degradation of reliability of the written data can be suppressed.

[4] In the data processing semiconductor device of aspect 3, the memory area has a first memory area (111) for writing or erasing data in the first operation mode and a second memory area (112) for writing or erasing data in the second operation mode. The control unit, upon writing or erasing in the second memory area in the second operation mode, generates information associating the address of the second memory area in which the writing or erasing has been performed and the address of the first memory area specified by a request of the write or erase, as the predetermined information. Accordingly, it is possible to store the data written or erased in the first operation mode and the data written or erased in the second operation mode in an easily distinguishable manner, and information of the address of the second memory area in which the writing or erasing has been performed can be easily acquired from information of the address of the specified first memory area, based on the predetermined information.

[5] In the data processing semiconductor device of aspect 3, the control unit, using the predetermined information as predetermined flag information in the second operation mode, adds the flag information to the data to be written in the second operation mode. Accordingly, the data written or erased in the first operation mode and the data written or erased in the second operation mode can be easily distinguished by the data itself.

[6] In the data processing semiconductor device of aspect 1, the first operation mode sets the upper limit of the temperature range for writing or erasing data to be lower than the upper limit of the temperature range that guarantees reading of data.

[7] In the data processing semiconductor device of aspect 1, the first operation mode sets the lower limit of the temperature range for writing or erasing data to be higher than the lower limit of the temperature range that guarantees reading of data.

[8] In the data processing semiconductor device of aspect 1, the control unit generates information indicating an error without writing or erasing the data in the memory area, if the temperature measured in the first operation mode is outside the temperature range for writing or erasing data. Based on the information indicating an error, it can be easily known that writing or erasing of data has not been performed.

[9] In the data processing semiconductor device of aspect 8, the information indicating an error includes information indicating that writing or erasing of data has not been performed.

[10] In the data processing semiconductor device of aspect 1, the memory area has a third memory area (901) for storing data constituting a program and a fourth memory area (902) for storing data, and the control unit controls the temperature range for writing or erasing data in the third memory area in the first operation mode to be narrower than the temperature range for writing or erasing data in the fourth memory area.

Since overwriting of the program, which is rarely performed on the system, is often performed under a stable temperature condition during the production process, the third memory area does not require a wide temperature range for writing or erasing. Therefore, according to article 10, the temperature range that controls writing or erasing in the third memory area is narrowed, and thus it is possible to complete writing or erasing in a short time.

[11] In the data processing semiconductor device of aspect 1, the control unit refers to the input temperature data for each predetermined operational unit when writing or erasing data. Accordingly, the possibility of writing or erasing data outside the temperature range becomes lower, even if the temperature varies after the temperature has been measured.

[12] In the data processing semiconductor device of aspect 10, if the input temperature data indicates a temperature outside the predetermined temperature range, the control unit performs a control of reading data corresponding to the data stored in the third memory area from an external storage device (20) when reading data in the third memory area. Accordingly, reading of data from the nonvolatile memory unit is not performed outside the guaranteed range of data reading, and thus reliability of the read-out data itself can be improved.

[13] The data processing semiconductor device of aspect 1 or 3 further comprises a temperature sensor unit (14, 22) which measures temperature and generates data of the measured temperature, and the control unit receives the generated temperature data. Accordingly, it is possible to control the nonvolatile memory area based on the temperature inside the data processing semiconductor device.

[14] The data processing semiconductor device (1 to 6) according to another representative embodiment of the present invention comprises a nonvolatile memory unit (11, 91) having a rewritable nonvolatile memory area, and a control unit (12, 30, 90, 120, 160) which controls reading, writing, or erasing of data in the memory area. The control unit has a first operation mode which, referring to input temperature data, controls a temperature range that guarantees writing or erasing of data to be narrower than a temperature range that guarantees reading of data in the memory area. Accordingly, the temperature that guarantees writing in the nonvolatile memory unit and the temperature that guarantees reading can be separately defined.

[15] In the data processing semiconductor device of aspect 14, the control unit writes or erases data in a second operation mode if the input temperature data indicates a temperature outside the temperature range for writing or erasing data in the first operation mode, and generates predetermined information for distinguishing the data from the data written or erased in the first operation mode. Accordingly, an effect similar to that of aspect 2 is exhibited.

[16] In the data processing semiconductor device of aspect 15, the control unit reads, based on the predetermined information, the data written in the second operation mode, and writes the read-out data in the first operation mode. Accordingly, an effect similar to that of aspect 3 is exhibited.

[17] In the data processing semiconductor device of aspect 14, the memory area has the third memory area (901) for storing a program for program control and the fourth memory area (902) for storing data, and the control unit controls, in the first operation mode, the temperature range that guarantees writing or erasing of data in the third memory area to be narrower than the temperature range that guarantees writing or erasing of data in the fourth memory area. Accordingly, an effect similar to that of aspect 10 is exhibited.

[18] In the data processing semiconductor device of aspect 14, the temperature range that guarantees reading of data is equal to the temperature range guaranteed in the entire semiconductor device.

2. Details of Embodiments

The embodiments are further described in detail.

Embodiment 1

A data processing semiconductor device having a built-in flash memory is illustrated in FIG. 1 as an embodiment of the present invention.

A data processing semiconductor device 1 shown in FIG. 1 is a vehicle-mounted LSI which is a microcomputer for controlling a car engine, for example.

The data processing semiconductor device 1 shown in FIG. 1 comprises a CPU 10, a flash memory unit 11, a writing or erasing sequencer (hereinafter, referred to as "P/E sequencer") 12, a temperature error register 13, a temperature sensor unit 14, a bus 15, a control register unit 16, and other input and output interface circuits which are not illustrated.

The CPU 10, which is a central processing unit that performs an operational processing according to a program, issues a request to read, write, or erase data.

The flash memory unit 11 has a rewritable nonvolatile memory area in which data such as a result of operation by the CPU 10 is stored.

The P/E sequencer 12 is a dedicated control logic circuit that includes an accelerator which controls access to the flash memory unit 11 in response to an access request from the CPU 10 to the flash memory unit 11, or other hardware logic circuits. Referring to the temperature measured by the temperature sensor unit 14, the PIE sequencer 12 controls reading or writing of data in the flash memory unit 11 based on a value of the control register unit 16.

The control register unit 16 stores information for performing the above-mentioned control based on the temperature, details of which are described below.

The temperature error register 13 stores information with regard to the result of an overwrite request of the flash memory unit 11, details of which are described below.

The temperature sensor unit 14, which is a block that measures temperature and outputs the measurement result in response to the request of the P/E sequencer 12, includes a control circuit 141, a temperature sensor 142, and a temperature register 143.

Controlled by the control circuit 141, the temperature sensor 142 measures temperature and generates temperature data based on the measurement result. In addition, the control circuit 141 controls the temperature sensor 142 in accordance with the temperature measurement request from the P/E sequencer 12, stores the temperature data generated by the temperature sensor 142 in the temperature register 143, and outputs the data via the bus 15.

Now, temperature dependence of the retention property and disturb resistance of a flash memory is explained.

Figure 2:
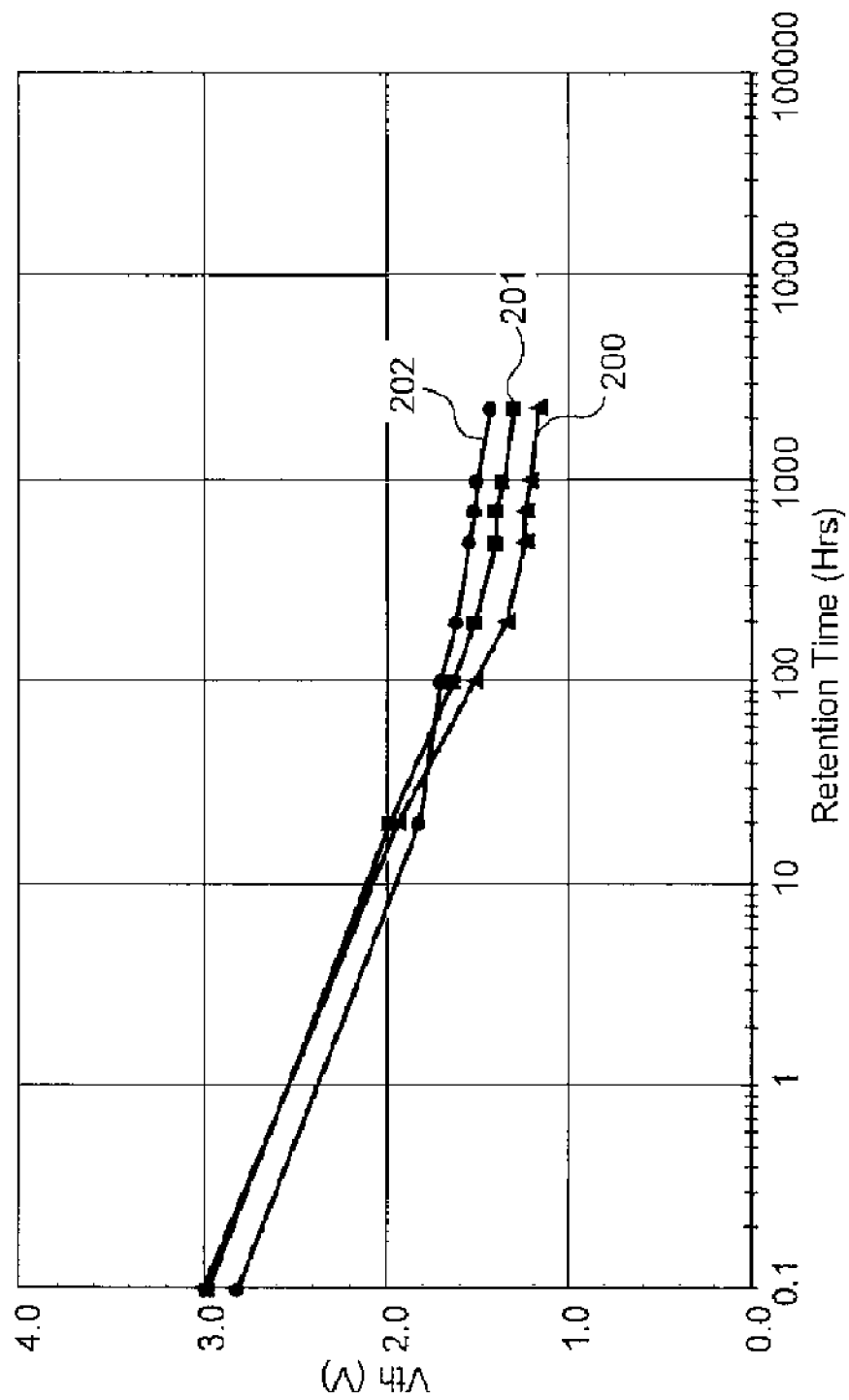
FIG. 2 is a chart illustrating an exemplary graph indicating temperature dependence of retention property of a flash memory.

FIG. 2 is a chart illustrating an exemplary graph indicating temperature dependence of the retention property of a general flash memory.

In FIG. 2, the vertical axis indicates the threshold voltage of a memory cell and the horizontal axis indicates the elapsed time. The graphs illustrated with reference numerals 200 to 202 indicate the relation between the threshold voltage of a memory cell in which data has been overwritten and the elapsed time. The graphs illustrated with reference numerals 200, 201, and 202 indicate the property of the memory cell in which data has been overwritten at temperatures of 160, 150, and 125 degrees, respectively.

According to FIG. 2, the memory cell in which data has been overwritten in a high temperature state shows a significant decrease of the threshold voltage over time. Therefore, overwriting of data should not be performed in a high temperature state.

Figure 3:
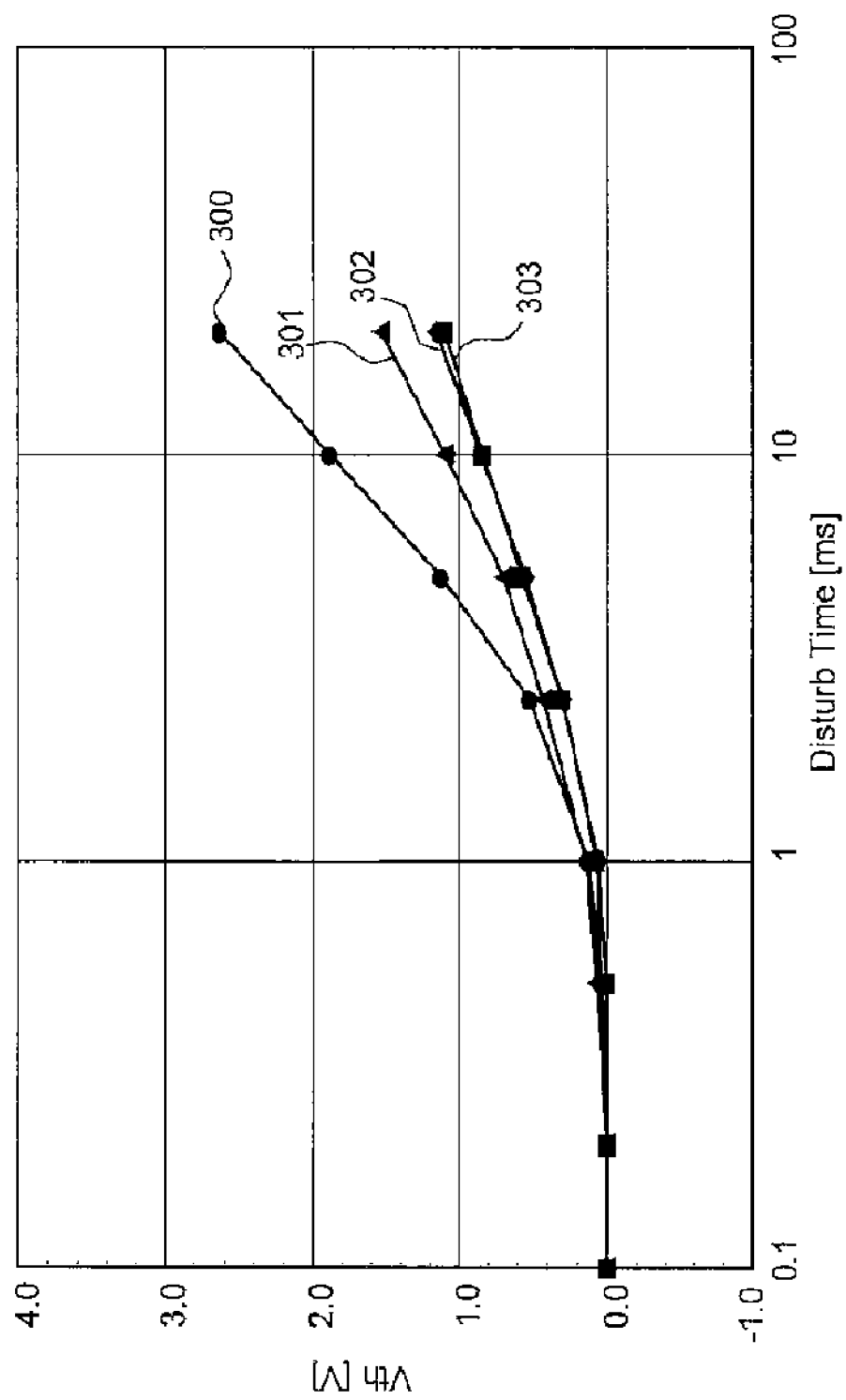
FIG. 3 is a chart illustrating an exemplary graph indicating temperature dependence of disturb resistance of a flash memory.

FIG. 3 is a chart illustrating an exemplary graph indicating temperature dependence of the disturb resistance of a general flash memory.

In FIG. 3, the vertical axis indicates the threshold voltage of a memory cell and the horizontal axis indicates time. The graphs illustrated with reference numerals 300 to 303 indicate the relation between the threshold voltage of the memory cell in which writing is performed as well as other memory cells having a voltage applied to the control gate thereof and the applied time of the voltage. The graphs illustrated with reference numerals 300, 301, 302, and 303 indicate the property at 160, 125, 25, and −40 degrees, respectively.

According to FIG. 3, overwriting of data in a high temperature state causes a significant degradation of the disturb resistance of the memory cell. In this case, taking measures such as lowering the level of voltage applied to the control gate when writing may adversely increase the time required for writing in the memory cell, thereby causing another negative effect such that the processing speed of the overwriting processing cannot be sufficiently increased.

In view of temperature dependence of the retention property and disturb resistance of the flash memory as described above, the P/E sequencer 12 has a function of performing overwriting under a predetermined temperature condition. For example, the P/E sequencer 12 overwrites data in the flash memory unit 11, according to the predetermined temperature range shown in FIG. 4.

FIG. 4 is a chart illustrating an exemplary control of data overwriting based on the predetermined temperature condition by the P/E sequencer 12.

In the following explanation, data writing refers to an operation of turning the memory cell into a writing state by raising the threshold voltage of the memory cell, for example, and data erasing refers to an operation of turning the memory cell into an erasing state by lowering the threshold voltage of the memory cell, for example.

As shown in FIG. 4, although the P/E sequencer 12 performs reading, writing, or erasing when the measured temperature is lower than 160 degrees, it does not in principle perform the writing or erasing when the measured temperature is between 160 degrees and 175 degrees. A temperature exceeding 175 degrees is outside an operation guarantee temperature, such that the writing or erasing of data is limited whereas reading is not limited, and reliability of the read-out data is not guaranteed. Here, the operation guarantee temperature is a temperature at which operation as a data processing semiconductor device is guaranteed. In FIG. 4, for example, a temperature that guarantees reading is equal to the operation guarantee temperature and a temperature that guarantees writing or erasing is lower than 160 degrees.

As described above, the P/E sequencer 12 has the first operation mode which writes or erases data in the flash memory unit 11 according to the predetermined temperature range shown in FIG. 4. By performing such a control of data overwriting, degradation of the retention property and deterioration of the disturb resistance of the flash memory due to temperature can be prevented.

The P/E sequencer 12 additionally has the following two functions.

The first function (referred to as "forced writing mode" in the following) writes or erases data as necessary even outside the predetermined temperature range that permits writing or erasing of data.

Although, in principle, the P/E sequencer 12 writes or erases data according to the first operation mode as described above, there may be a situation that requires writing or erasing of data at an ultra-high temperature (160 degrees or more). For example, if some abnormality occurs in the car engine or the like to cause an ultra-high temperature state while recording the run data in the flash memory unit 11 with the data processing semiconductor device 1 mounted on the engine unit of a car, it may be considered to record the run data at that time and later use the data for cause analysis of the engine trouble. Therefore the P/E sequencer 12 has the forced writing mode.

The second function is a refresh operation that rewrites the data, which has been overwritten in the forced writing mode, within the predetermined temperature range that permits writing or erasing.

Reliability of the data overwritten in the forced writing mode becomes lower than that of the data overwritten in the first operation mode as shown in the FIGS. 2 and 3. Therefore, if data has been overwritten in the forced writing mode, the P/E sequencer 12 overwrites the data in the first operation mode again through the refresh operation.

The above-mentioned function of the P/E sequencer 12 is explained in detail below.

Figure 5:
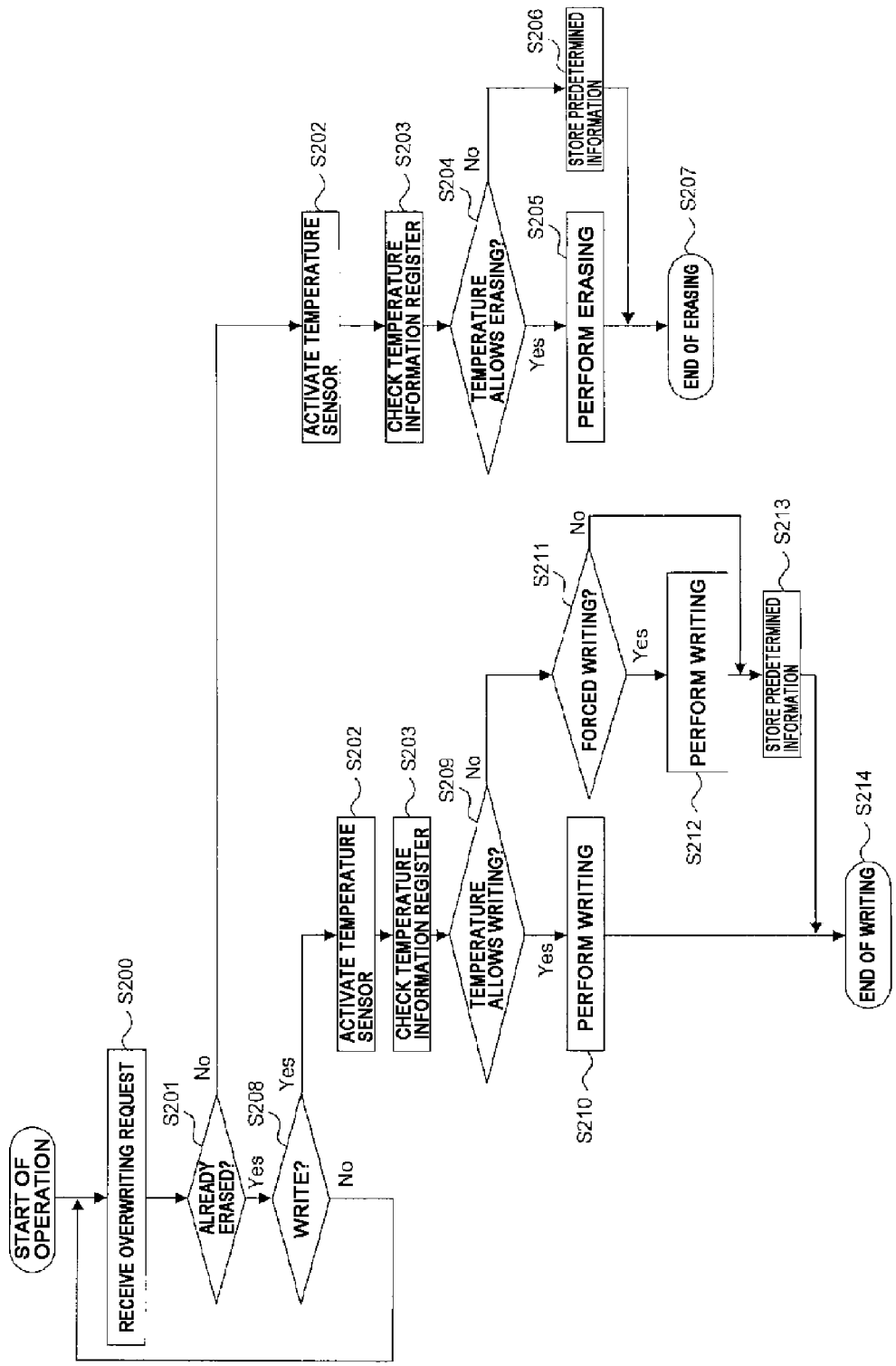
FIG. 5 is a chart illustrating an exemplary operation flow of overwriting data in a flash memory unit 11.

First, an operation flow of overwriting data in the flash memory unit 11 by the P/E sequencer 12 is described, referring to FIG. 5.

FIG. 5 is a chart illustrating an exemplary operation flow of overwriting data in the flash memory unit 11.

First, a data overwrite request for the flash memory unit 11 is output from the CPU 10 to the bus 15, and the P/E sequencer 12 receives the request via the bus 15 (S200). The P/E sequencer 12 then checks whether or not the data has been erased in the memory area of the flash memory unit 11 corresponding to the memory address for which the overwriting is specified (S201). If data in the memory area of the flash memory unit 11 has not been erased, the P/E sequencer 12 starts a data erasing process, and requests measurement of temperature to the temperature sensor unit 14 (S202). The control circuit 141 that received the request stores the temperature data generated based on the result of measurement at the temperature sensor 142, in the temperature information register 143, and outputs the temperature data to the bus 15 (S203). The P/E sequencer receives the temperature data from the bus 15 and determines whether or not the input temperature data indicates a temperature within the predetermined temperature range that permits writing or erasing of data (S204). Specifically, the control register unit 16 has a temperature range register 161 which defines a temperature range that permits writing or erasing, and the P/E sequencer 12 refers to the value of the temperature range register 161 to determine whether or not the input temperature data indicates a temperature within the predetermined temperature range. The value of the temperature range register 161 is preliminarily set by the CPU 10 at the time of power-on resetting, for example.

If the temperature indicated by the input temperature data is within the predetermined temperature range that permits writing or erasing, as a result of the determination, the P/E sequencer 12 erases the data in the first operation mode (S205). The P/E sequencer 12 then notifies the CPU 10 that the erasing has been completed and terminates the erase operation (S207).

If, on the other hand, the temperature is not within the predetermined temperature range as a result of the determination at step 204, the P/E sequencer 12 does not erase the data, and writes into the temperature error register 13 and notifies the CPU 10 of error information indicating that erasing has not been performed, together with the temperature data at that time (S206), and terminates the erase operation (S207). By generating the error information and storing it into the temperature error register 13 as described above, it becomes possible to preserve information such as temperature situation in which overwriting of data has not been performed and output the information to the outside as necessary.

If it is determined at step 201 that the data is erased in the memory area of the flash memory unit 11 corresponding to the memory address for which the overwriting has been specified, or the above-mentioned data erasing (S202 to S207) is completed, the P/E sequencer 12 checks the overwrite request and further determines whether or not to write data (S208). If the request does not require writing of data, the process waits until a data overwrite request is issued from the CPU 101 again.

On the other hand, if the request requires writing of data, the P/E sequencer 12 starts write operation of data, requests measurement of temperature to the temperature sensor unit 14 similarly to when erasing the data, and receives the temperature data (S202, S203). The P/E sequencer 12 then determines in a similar manner as when erasing the data whether or not the temperature data is within the predetermined temperature range that permits writing or erasing of data (S209).

If, as a result of the determination at step 209, the temperature indicated by the temperature data is within the predetermined temperature range that permits writing or erasing, the P/E sequencer 12 writes data into the flash memory unit 11 in the first operation mode (S210), notifies the CPU 10 that the writing has been completed, and terminates the operation (S214).

On the other hand, if, as a result of the determination at step 209, the temperature indicated by the temperature data is outside the predetermined temperature range that permits writing or erasing, the P/E sequencer 12 determines whether or not the forced writing is permitted outside the predetermined temperature range (S211). Specifically, the control register unit 16 has a forced writing mode register 162 which defines whether or not to permit writing in the forced writing mode, and the P/E sequencer 12 determines whether or not a value has been set in the forced writing mode register 162.

If, as a result of the determination at step 211, there is no value set in the forced writing mode register 162, the P/E sequencer 12 does not write the data, and writes into the temperature error register 13 error information indicating that writing has not been performed, together with the temperature data at that time (S213). The P/E sequencer 12 then notifies the CPU 10 that writing has not been performed and terminates the write operation (S214).

If, on the other hand, a value is set in the forced writing mode register 162 at step 211, the P/E sequencer 12 writes data in the forced writing mode (S212). In this occasion, the P/E sequencer 12 stores the data written in the forced writing mode and the data written in the first operation mode in a distinguishable manner, and stores predetermined information in the temperature error register 13 (S213). Details of how to store the information is described below. The P/E sequencer 12 then notifies the CPU 10 that the writing has been completed and terminates the write operation (S214).

Next, a specific method of overwriting data by the P/E sequencer 12 is explained.

As described above, the P/E sequencer 12 overwrites data in the flash memory unit 11 in a manner distinguishing the first operation mode and the forced writing mode. The P/E sequencer 12 employs the following two methods as the method of overwriting data in a distinguishable manner.

The first method separates the memory area to which data is overwritten in the first operation mode from the memory area to which data is overwritten in the forced writing mode.

Figure 6:
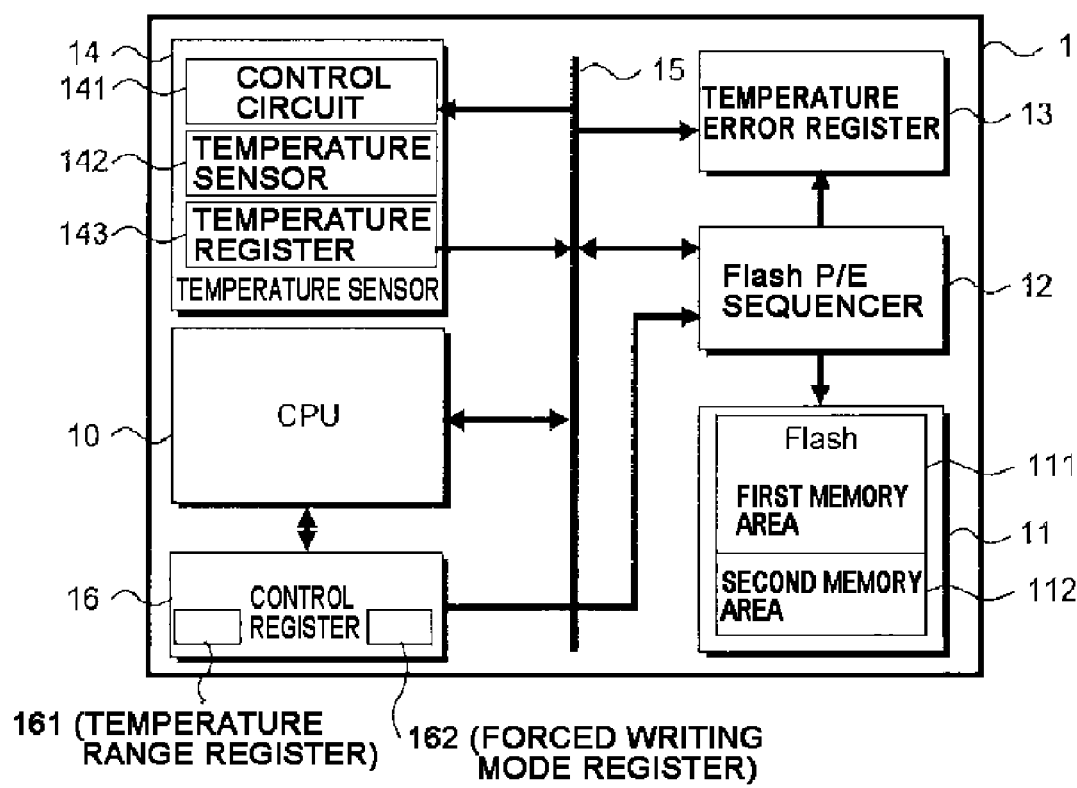
FIG. 6 is an explanatory chart illustrating a data processing semiconductor device 1 employing a first method.

FIG. 6 is an explanatory chart illustrating the data processing semiconductor device 1 employing the first method.

In FIG. 6, the flash memory unit 11 in the data processing semiconductor device 1 has a first memory area 111 and a second memory area 112, wherein the first memory area 111 is used as the data-overwrite destination in the first operation mode, and the second memory area 112 is used as the data-overwrite destination in the forced writing mode.

The operation flow of writing or erasing data in the data processing semiconductor device 1 employing the first method is described below.

First, when requesting overwriting of data to the P/E sequencer 12, the CPU 10 specifies the address of the first memory area as the data-overwrite destination. Upon receiving the request, the P/E sequencer 12 starts write or erase operation of data according to the operation flow diagram of FIG. 5.

If, at step 209 of FIG. 5, the temperature indicated by the temperature data which has been input to the P/E sequencer 12 is outside the predetermined temperature range that permits writing of data, the P/E sequencer 12 writes data into the second memory area 112 in the forced writing mode at step 211. The P/E sequencer 12 then generates, at step 213, predetermined information for distinguishing the data written in the first operation mode from the data written in the forced writing mode, and stores the information in the temperature error register 13 together with the temperature data at that time. Here, the predetermined information for the distinction is, for example, address correspondence information indicating the correspondence relation between the address of the first memory area 111 specified by the CPU 10 and the address of the second memory area 112 to which the data has been written.

Next, a method of reading the data stored according to the first method is provided below.

First, when issuing a data read request, the CPU 10 specifies the address of the first memory area 111 which has been specified when writing the data, as a specified address of the flash memory unit 11 from which data is read, and issues the data read request. Upon receiving the read request, the P/E sequencer 12 refers to the address correspondence information stored in the temperature error register 13. The P/E sequencer 12 then acquires the address of the second memory area 112 corresponding to the specified address of first memory area 111, based on the address correspondence information, and reads the data from the second memory area 112.

According to the first method, by separating the memory area in which data is overwritten in the first operation mode from the memory area in which overwriting is performed in the forced writing mode, data written in respective modes can be stored in a distinguishable manner. Additionally, when reading data which has been overwritten in the forced writing mode, the data can be easily read by using the address correspondence information.

Next, a second method according to the method of overwriting data is explained.

The second method stores the data in the first operation mode and the data in the forced writing mode in a same memory area of the flash memory unit 11 in a distinguishable manner.

Figure 7:
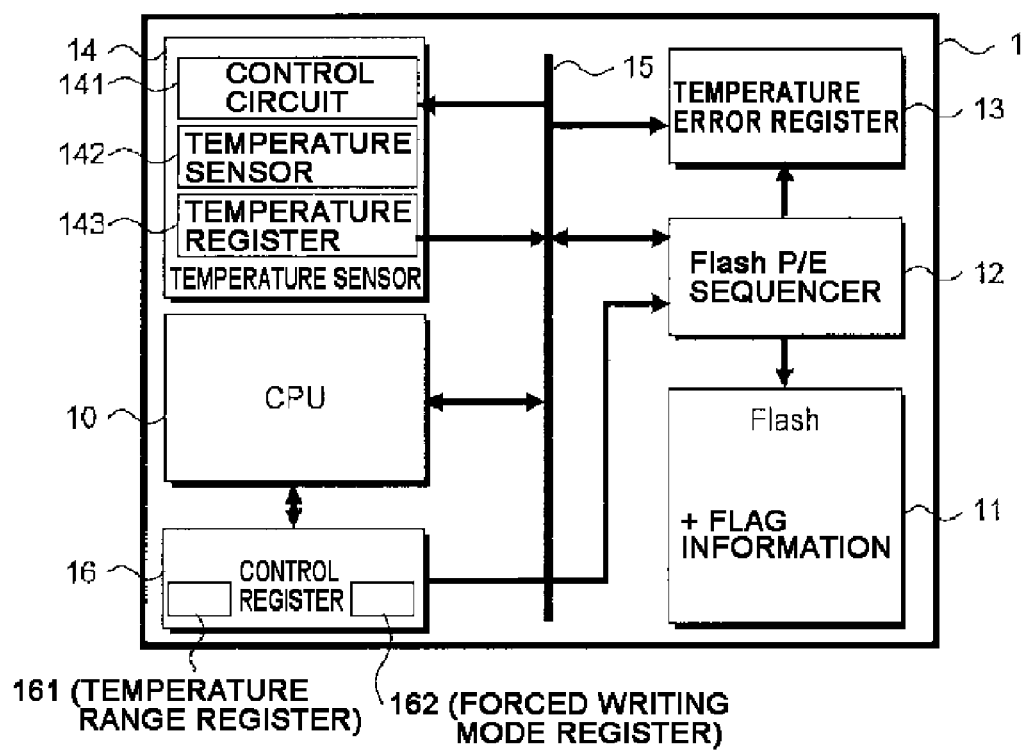
FIG. 7 is an explanatory chart illustrating the data processing semiconductor device 1 employing a second method.

FIG. 7 is an explanatory chart illustrating the data processing semiconductor device 1 employing the second method.

The operation flow when overwriting data in the data processing semiconductor device 1 employing the second method is described below.

First, the P/E sequencer 12 starts overwrite operation of data according to the operation flow of FIG. 5 upon receiving a overwrite request from the CPU 10.

If, at step 211 of FIG. 5, the temperature indicated by the temperature data which has been input to the P/E sequencer is outside the predetermined temperature range that permits writing or erasing of data, and a value indicating forced writing has been set in the forced writing mode register 162, the P/E sequencer 12 writes data into the memory area of the flash memory unit 11 in the forced writing mode. In this occasion, the P/E sequencer 12 generates predetermined flag information, adds the flag information to the data to be written, and writes the added data into the memory area. For example, the P/E sequencer 12 adds, to the head of the data to be written, a one-bit or two-bit flag indicating that the data has been written in the forced writing mode, and writes the flag into the memory area of the flash memory unit 11. Here, the flag information may be added on a word-by-word basis when data is written on a word-by-word basis, or may be added to each of the data relating to the overwrite request.

The P/E sequencer 12 which has overwritten the data then stores at step 213, the address information of the memory area in which the data has been written or erased and the temperature data at that time in the temperature error register 13.

As described above, according to the second method, it is easy to determine in which mode the data has been overwritten by checking the data itself stored in the memory area, because the data in the first operation mode and the data in the forced writing mode are distinguished by the flag information added to the data.

Figure 8:
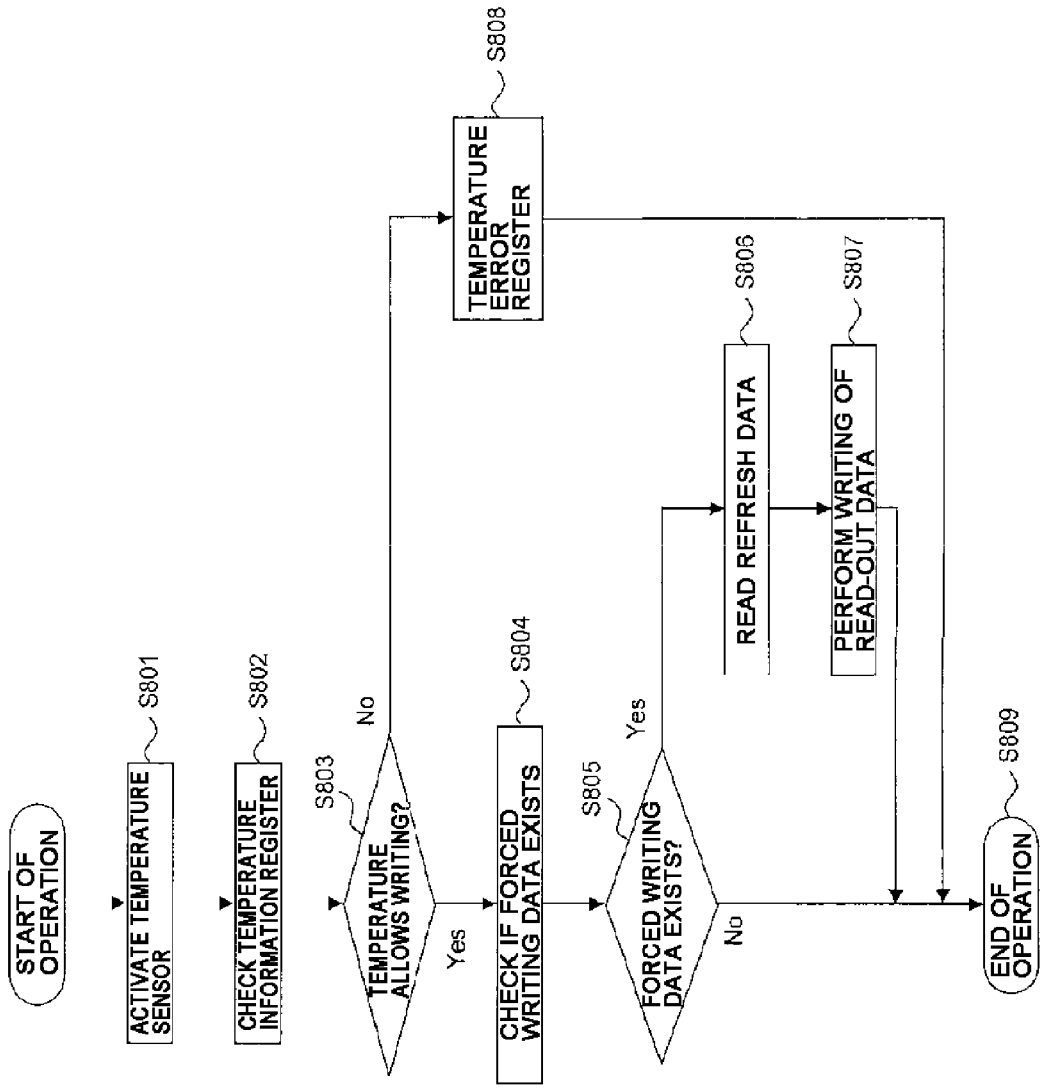
FIG. 8 is a chart illustrating an exemplary operation flow of a refresh operation.

Next, the refresh operation, which is the other function of the P/E sequencer 12, is explained in detail, referring to FIG. 8.

FIG. 8 is a chart illustrating an exemplary operation flow of the refresh operation.

First, the CPU 10 issues a refresh request to the P/E sequencer 12. Upon receiving the request, the P/E sequencer 12 requests the temperature sensor unit 14 to measure the temperature (S801). The control circuit 141 of the temperature sensor unit 14 that received the request stores in the temperature register 143 the temperature data generated based on the temperature measured by the temperature sensor 142, and outputs the temperature data to the bus 15 (S802). The P/E sequencer 12 then receives the temperature data from the bus 15, and determines whether or not the temperature indicated by the input temperature data is within the predetermined temperature range that permits writing or erasing of data (S803).

If, as a result of the determination at step 803, the temperature is outside the predetermined temperature range, the P/E sequencer 12 does not perform the refresh operation, stores information indicating that the refresh operation has not been performed in the temperature error register 13, as well as notifying the CPU 10 of the fact (S808), and terminates the operation (S809).

On the other hand, if, as a result of the determination at step 803, the temperature is outside the predetermined temperature range that permits writing or erasing of data, the P/E sequencer 12 determines whether or not the data written or erased in the forced writing mode is stored in the memory area of the flash memory unit 11 (S804). Specifically, the P/E sequencer 12 determines whether or not the data written or erased in the forced writing mode is stored in the flash memory unit 11 by referring to the predetermined information stored in the temperature error register 13. If the data is stored according to the first method, for example, it is determined whether or not the data in the forced writing mode exists, by referring to the address correspondence information as the predetermined information stored in the temperature error register 13.

Additionally, if the data is stored according to the second method, it is determined whether or not the data in the forced writing mode exists, by referring to the address information of destination of the data written in the forced writing mode as the predetermined information stored in the temperature error register 13.

If, as a result of the determination at step 804, there exists no data in the forced writing mode, the P/E sequencer 12 notifies the CPU 10 of the fact and terminates the refresh operation (S809).

On the other hand, if, as a result of the determination, there exists data in the forced writing mode, the P/E sequencer 12 reads, based on the address correspondence information or the address information, data from the memory area of the flash memory unit 11 corresponding to the address (S806), and rewrites the read-out data (S807).

A specific method of rewriting the data is explained below.

If data is stored according to the first method, the data read from the second memory area, for example, is written into the first memory area corresponding to the second memory area. In other words, the first memory area to which the data is rewritten is the memory area indicated by the address of the first memory area corresponding to the address of the second memory area indicated by the address correspondence information.

If, on the other hand, data is stored according to the second method, the P/E sequencer 12 deletes the flag information which is added to the read-out data and indicates that the data is written in the forced writing mode, or changes the added flag information into flag information indicating that the data is written in the first operation mode, and rewrites the data into the same memory area as the memory area from which the data has been read.

The P/E sequencer 12 that has rewritten the data according to the above method deletes the address correspondence information from the temperature error register 13, notifies the CPU 10 that the refresh operation is completed and terminates the operation (S809).

As described above, according to the refresh operation, rewriting of data is performed in the first operation mode even if the data has been overwritten in the forced writing mode, and whereby degradation of the data retention property is suppressed and reliability of the data can be improved.

The refresh operation may be started by the CPU 10 issuing a request to the P/E sequencer 12 for each predetermined period, or the CPU 10 may periodically check the temperature error register 13 and issue a request to start the refresh operation if existence of data overwritten in the forced writing mode is confirmed.

Embodiment 2

Figure 9:
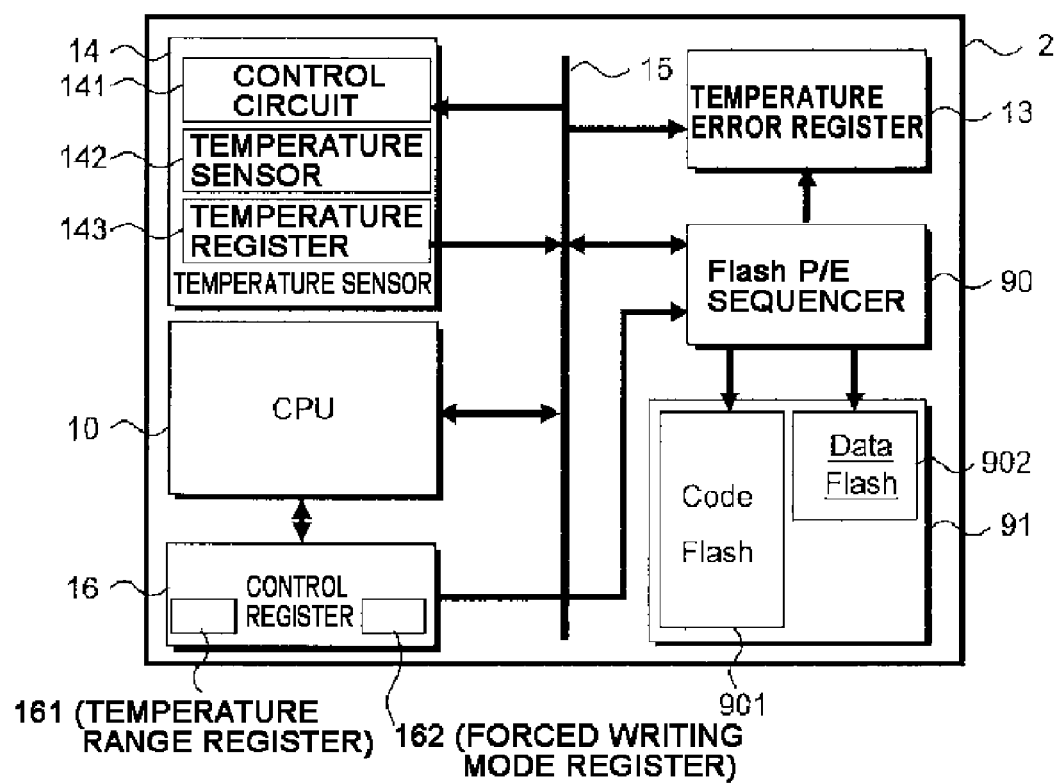
FIG. 9 is a chart illustrating a data processing semiconductor device according to an embodiment 2.

FIG. 9 is a data processing semiconductor device according to another embodiment of the present invention.

The data processing semiconductor device 1 has limited writing or erasing in the whole memory area of the flash memory unit 11 to a uniform temperature range. In addition to the function of the data processing semiconductor device 1, the data processing semiconductor device 2 shown in FIG. 9 controls the temperature range that limits writing or erasing of data individually for each memory area.

In FIG. 9, identical reference numerals are provided to components that are identical to those of the data processing semiconductor device 1, with detailed description thereof being omitted.

The data processing semiconductor device 2 shown in FIG. 9 comprises two memory areas in a flash memory unit 91. One of the memory areas is a code memory area 901, and the other memory area is a data memory area 902.

The code memory area 901 is, for example, a memory area in which a program code of a program executed by the CPU 10 is mainly stored. Mainly used for reading out a program, the memory area is used when the CPU 10 executes the program. Additionally, in many cases, writing or erasing of data constituting a program in the memory area is generally performed in an environment such as a factory where the temperature condition is relatively stable. Therefore, although the code memory area 901 requires a wide temperature range for reading data, a wide temperature range is unnecessary for writing or erasing data.

The data memory area 902, on the other hand, is a memory area in which the result of operational process by the CPU 10, for example, is mainly stored. For example, run data or the like is written in the memory area while the car is running. Therefore, not only reading but also writing or erasing of data requires a wide temperature range.

The P/E sequencer 90 controls reading or overwriting for each memory area based on a data read or overwrite request from the CPU 10 to the code memory area 901 and the data memory area 902. In addition, the P/E sequencer 90 has the forced writing mode and the function of refresh operation as with the P/E sequencer 12.

FIGS. 10(*a*) to 10(*c*) are charts each illustrating an exemplary method of controlling writing or erasing of data in each memory area by the P/E sequencer 90.

FIG. 10(*a*) is an exemplary case of setting, separately for the code memory area 901 and the data memory area 902, a temperature range that permits writing or erasing of data.

In FIG. 10(*a*), writing or erasing is limited in the code memory area 901 for a temperature range from −40 to −10 degrees and a temperature higher than 125 degrees. Accordingly, the code memory area 901 can suppress degradation of the retention property and the disturb resistance of the data, measures such as lowering the level of the voltage applied to the control gate when writing as described above become unnecessary, and the speed of writing or erasing is not decreased. On the other hand, writing or erasing of data is limited in the data memory area 902 for a temperature exceeding 160 degrees, and writing or erasing of data is permitted in a wider temperature range compared to the above code memory area 901.

FIG. 10(*b*) is an exemplary case of separately setting a temperature range that permits data writing and a temperature range that permits data erasing.

In FIG. 10(*b*), writing of data into the code memory area 901 and the data memory area 902 is limited for a temperature higher than 125 degrees. In addition, erasing of data in the code memory area 901 and the data memory area 902 is limited for a temperature range from −40 to −10 degrees and a temperature higher than 160 degrees. The reason for thus limiting the erasing of data in a flash memory to a low temperature is as follows.

Figure 11:
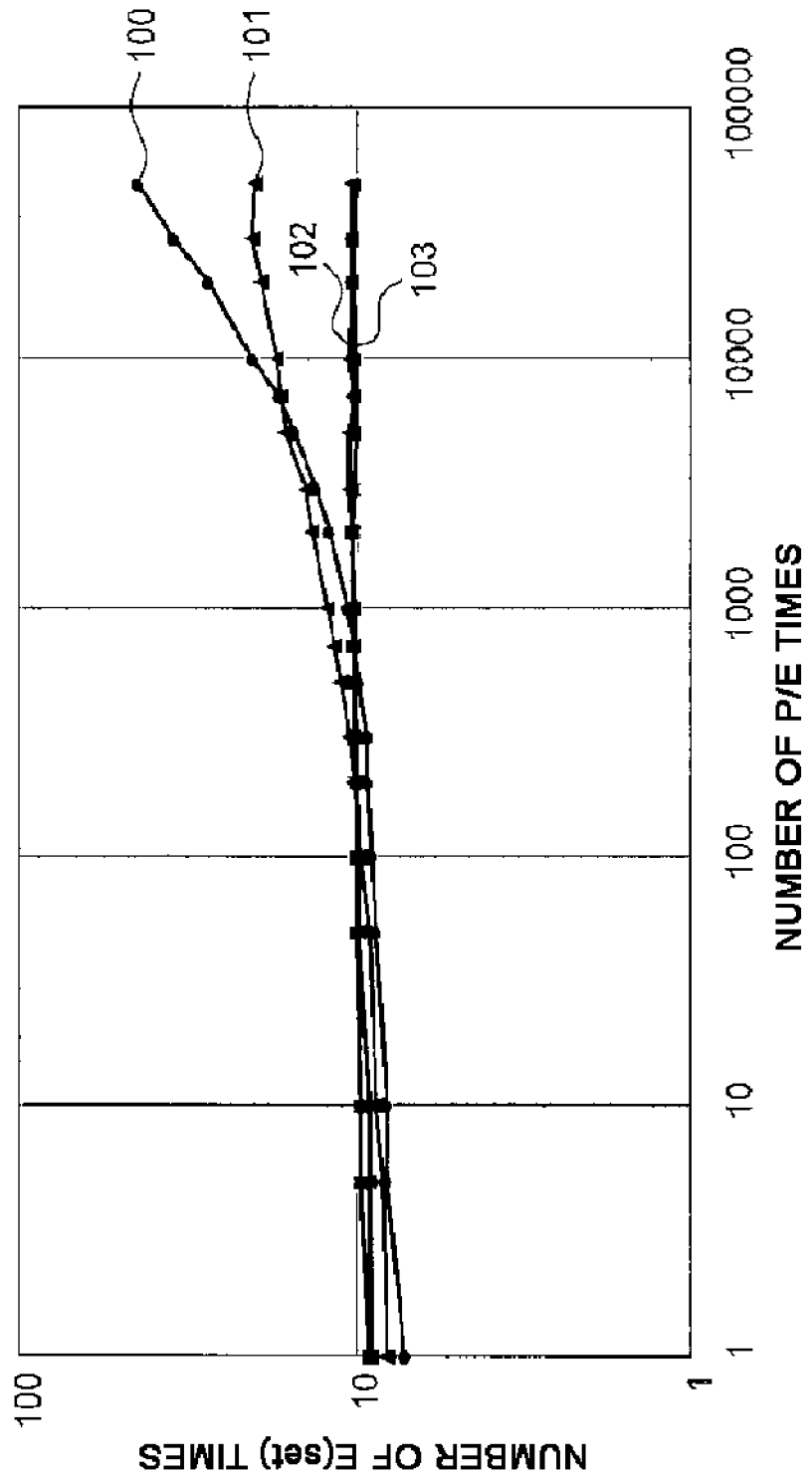
FIG. 11 is a chart illustrating an exemplary graph indicating a property with regard to erasing a memory cell of the flash memory.

FIG. 11 is a chart illustrating an exemplary property with regard to erasing a memory cell of a flash memory.

In FIG. 11, the vertical axis indicates the number of voltage application times required to erase data in the memory cell, and the horizontal axis indicates the accumulative number of times of writing or erasing in the memory cell. The graph illustrated with reference numerals 100, 101, 102, and 103 indicate the property of the number of voltage application times required to erase data with regard to the memory cell in which data is overwritten at −40, 25, 125, and 150 degrees, respectively.

According to FIG. 11, in a memory cell written at a lower temperature state, the number of voltage application times required to erase data significantly increases over time. Therefore, increase of the number of voltage application times required to erase data can be suppressed by limiting the erasing of data at an ultra-low temperature (temperature lower than −10 degrees) as shown in FIG. 10(*b*), and whereby increase of processing time required to erase data can be suppressed.

As shown in FIG. 10(*b*), a setting may be done at the high-temperature side such that data erasing is permitted but writing is not permitted.

FIG. 10(*c*) is another exemplary case of separately setting a temperature range that permits data writing and a temperature range that permits data erasing.

In FIG. 10(*c*), writing or erasing in the code memory area 901 is limited for a temperature range from −40 degrees to −10 degrees and a temperature higher than 125 degrees. On the other hand, writing in the data memory area 902 is limited for a temperature higher than 125 degrees, and erasing in the data memory area 902 is limited for a temperature range from −40 degrees to −10 degrees and a temperature higher than 160 degrees. Accordingly, the code memory area 901 exhibits a similar effect as with FIG. 10(*a*), and the data memory area 902 exhibits a similar effect as with FIG. 10(*b*).

As described above, according to the data processing semiconductor device 2, overwriting of data is controlled based on a temperature range which has been set according to usage of each memory area in the flash memory unit 91, and thus the performance of the data processing semiconductor product mounting the flash memory can be exerted to the maximum extent and an effect similar to that of the data processing semiconductor device 1 is exhibited.

Embodiment 3

Figure 12:
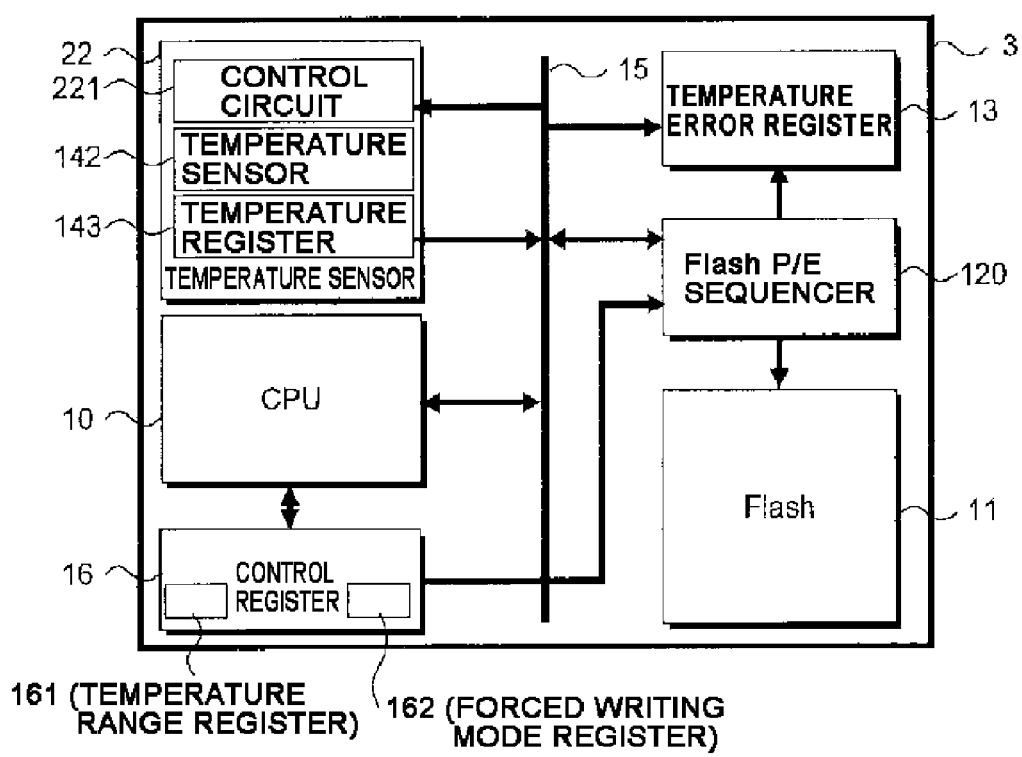
FIG. 12 is a chart illustrating a data processing semiconductor device according to an embodiment 3.

FIG. 12 is a chart illustrating a data processing semiconductor device according to another embodiment of the present invention.

A data processing semiconductor device 3 shown in FIG. 12 refers to the result of temperature measurement for each predetermined operational unit when overwriting data, with other functions being similar to those of the data processing semiconductor device 1.

In FIG. 12, identical reference numerals are provided to components that are identical to those of the data processing semiconductor device 1, with detailed description thereof being omitted.

The data processing semiconductor device 3 comprises a temperature sensor unit 22 and a P/E sequencer 120.

The temperature sensor unit 22 includes a control circuit 221, the temperature sensor 142, and the temperature register 143.

Upon receiving a request of temperature measurement from the P/E sequencer 120, the control circuit 221 controls the temperature sensor 142, and stores in the temperature register 143 the temperature data generated in the temperature sensor 142. The control circuit 221 then controls the temperature sensor 142 periodically for a predetermined time interval, and stores the temperature data in the temperature register 143. For example, the predetermined time interval is 10 ms or less. Accordingly, the temperature data of the temperature register 143 is updated regularly.

The P/E sequencer 120 has a data overwrite function in the first operation mode, a data overwrite function in the forced writing mode, and the refresh function as with the P/E sequencer 12. However, the operation flow of the P/E sequencer 120 when overwriting data is different from that of the P/E sequencer 12. Specifically, the timing of referring to the result of temperature measurement when overwriting data is different from that of the P/E sequencer 12.

Figure 13:
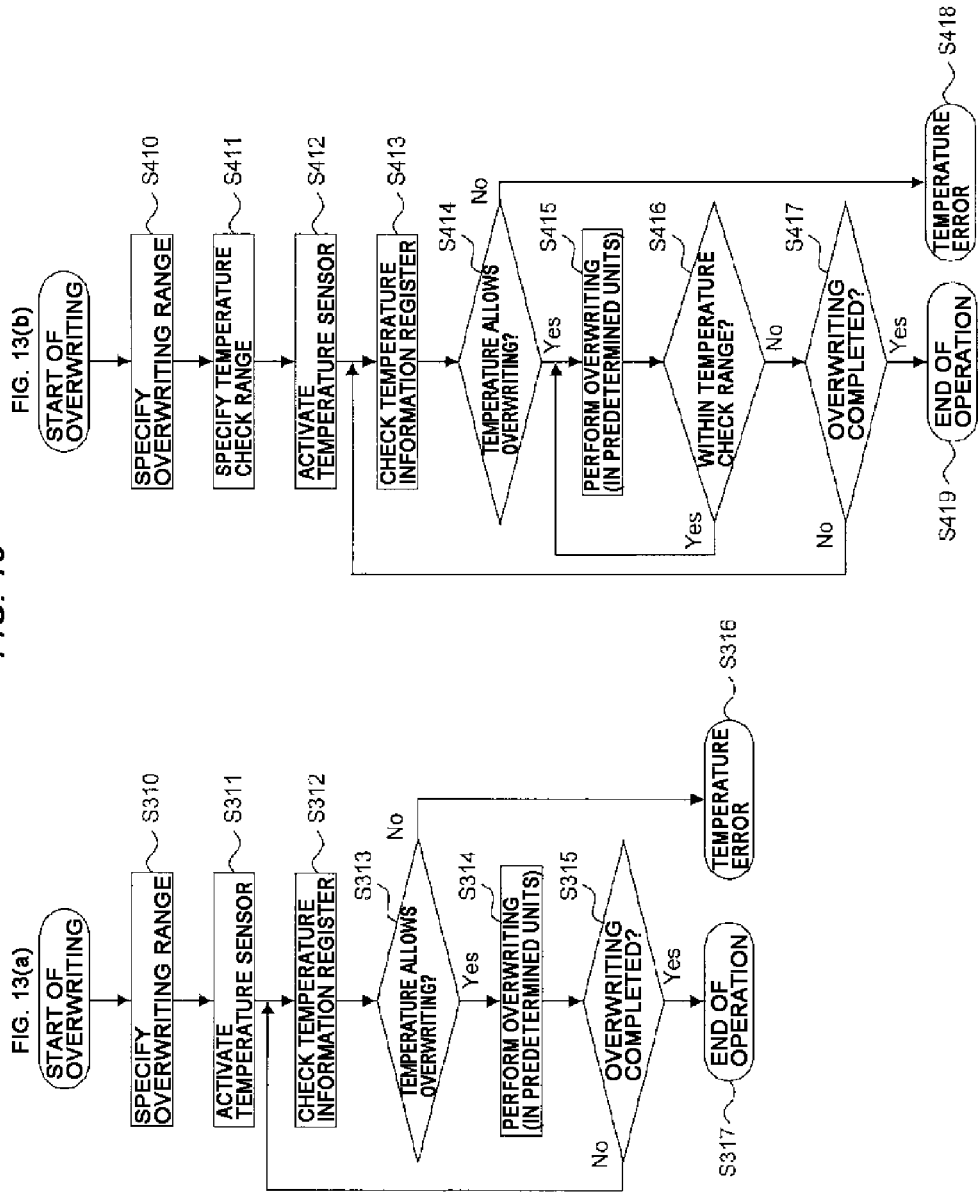
FIGS. 13(a) and 13(b) are charts each illustrating an exemplary operation flow of overwriting data according to a P/E sequencer 120.

The P/E sequencer 120 employs any of the methods shown in FIG. 13, for example, as the operation flow of overwriting data.

FIGS. 13(*a*) and 13(*b*) are charts each illustrating an exemplary operation flow when overwriting data by the P/E sequencer 120.

The operation flow of FIG. 13(*a*) is explained.

FIG. 13(*a*) is the operation flow of the P/E sequencer 120 when referring to the result of temperature measurement for each unit of data overwriting.

First, upon receiving a data overwrite request from the CPU 10, the P/E sequencer 120 sets a memory area specified by the request as a data-overwrite destination (S310). For example, the setting is performed by setting the address information of the specified memory area to a register or the like in the P/E sequencer 120. Next, the P/E sequencer 120 requests measurement of temperature to the temperature sensor unit 22 (S311). Upon receiving the request, the control circuit 221 stores in the temperature register 143 the temperature data generated by controlling the temperature sensor 142. The P/E sequencer 120 then refers to the temperature register 143, and acquires a value of the temperature data (S312). The P/E sequencer 120 determines whether or not the temperature indicating the acquired temperature data is within the predetermined temperature range that permits overwriting of data (S313). A specific determination method is similar to that of the P/E sequencer 12.

If, at step 313, the temperature indicated by the temperature data is not within the predetermined temperature range that permits overwriting of data and the forced writing mode has not been set, overwrite operation of data is finished (S316) as with the P/E sequencer 12. On the other hand, if, at step 313, the temperature indicated by the temperature data is within the predetermined temperature range that permits overwriting of data, the P/E sequencer 120 starts overwriting of data as with the P/E sequencer 12. In addition, overwriting of data is similarly started if the temperature indicated by the temperature data is outside the predetermined temperature range that permits overwriting of data and the forced writing mode has been set.

Overwriting of the data is performed for each data in predetermined units (S314). For example, with a specification that performs data writing into the memory area of the flash memory unit 11 on a word-by-word basis, the P/E sequencer 120 overwrites each data on a word-by-word basis.

When overwriting of data by the P/E sequencer 120 in the predetermined units is completed, the P/E sequencer 120 determines whether or not overwriting of data according to the request of the CPU 10 has been completed (S315). In other words, the P/E sequencer 120 determines whether or not overwriting of all data in the memory area specified by the CPU 10 has been completed.

If, as a result of the determination at step 315, overwriting of all data has been completed, the P/E sequencer 120 terminates overwrite operation of data and notifies the CPU 10 of the fact (S317).

On the other hand, if, as a result of the determination at step 315, overwriting of all data has not been completed, the process proceeds to step 312 where the P/E sequencer 120 acquires a value of the temperature register 143 again to overwrite the next data in the predetermined units, and performs overwriting of data in a procedure similarly to that described above (S312 to S316). In other words, the P/E sequencer 120 controls overwriting of data each time it performs overwriting of data in the predetermined units, referring to the result of temperature measurement.

According to the operation flow shown in FIG. 13(a), the result of temperature measurement is referred for each unit of data overwriting, and thus the possibility of performing data overwriting outside the predetermined temperature range becomes lower even if the temperature varies after the temperature measurement The operation flow of FIG. 13(b) is explained next.

FIG. 13(b) is the operation flow of the P/E sequencer 120 when referring to the result of temperature measurement each time it starts overwriting of data in the predetermined range of memory area of the flash memory unit 11.

Here, the predetermined range is a range indicated by a memory address or the like of the memory area of the flash memory unit 11, for example.

First, upon receiving a data overwrite request from the CPU 10, the P/E sequencer 120 sets the memory area specified by the request as the data-overwrite destination (S410). The setting is performed, for example, by setting the address information of the specified memory area in a register or the like in the P/E sequencer 120.

Next, the P/E sequencer 120 sets the predetermined range of memory area (S411). A specific setting method is, for example, such that the P/E sequencer 120 receives from the CPU 10 the address information indicating the predetermined range of memory area together with the data overwrite request, and sets a value in a register or the like for defining the predetermined range of memory area. Alternatively, a method may be possible such that the CPU 10 preliminarily sets a value in a register or the like, and the P/E sequencer 120 checks the value of the register.

The predetermined range of memory area may be, for example, the entire memory area of the flash memory unit 11 or, if the flash memory area 91 has two memory areas like the data processing semiconductor device 2, each of the memory areas may be set as the predetermined range of memory area.

Next, the P/E sequencer 120 requests measurement of temperature to the temperature sensor unit 22, receives the temperature data, and checks whether or not the temperature indicated by the temperature data is within the temperature range that permits overwriting of data (S412 to S414). A specific checking method is similar to that of FIG. 13(a) described above.

If, at step 414, the temperature is not outside the predetermined temperature range that permits overwriting of data and the forced writing mode has not been set, overwrite operation of data is finished (S418), the same as FIG. 13(a) described above. On the other hand, if, at step 414, the temperature is within the predetermined temperature range that permits overwriting of data, the P/E sequencer 120 starts overwriting of data as with the P/E sequencer 12. In addition, overwriting of data is similarly started if the temperature is outside the predetermined temperature range that permits overwriting of data and the forced writing mode has been set.

Overwriting of the data is performed for each data in predetermined units (S415), the same as FIG. 13(a). Upon completion of overwriting data in the predetermined units, the P/E sequencer 120 determines whether or not the memory area to be the next data-overwrite destination in the predetermined units is a memory area within the predetermined range that has been set at step 411 (S416).

If, as a result of the determination at step 416, the memory area to be the next data-overwrite destination is a memory area within the predetermined range, the process proceeds to step 415 again where overwriting of data is performed in the next overwrite unit (S415). In other words, the P/E sequencer 120 performs overwriting of data continuously without referring to the result of temperature measurement as long as overwriting of data is continued in the memory area within the predetermined range.

On the other hand, if, as a result of the determination at step 416, the next data-overwrite destination is not a memory area within the predetermined range, the P/E sequencer 120 determines whether or not overwriting of data according to the request of the CPU 10 has been completed (S417). In other words, the P/E sequencer 120 determines whether or not overwriting of all data in the memory area specified by the CPU 10 has been completed.

If, as a result of the determination at step 417, overwriting of all data has been completed, the P/E sequencer 120 terminates overwrite operation of data and notifies the CPU 10 of the fact (S419).

If, as a result of the determination at step 417, overwriting of the data has not been completed, the process proceeds to step 413 where the P/E sequencer 120 acquires the result of temperature measurement again and overwrites the data by a procedure similar to that described above (S413 to S418).

According to the operation flow shown in FIG. 13(b), the P/E sequencer 120 performs overwriting of data continuously without referring to the result of temperature measurement as long as overwriting of data is continued in the memory area within the predetermined range, and thus it becomes possible to reduce the number of times for the P/E sequencer 120 to refer to the result of temperature measurement. As a result, increase of the overall processing time associated with overwriting of data due to increase of time required for referring to the result of temperature measurement can be suppressed low.

The method of controlling overwriting of data by the P/E sequencer 120 described above can use one of the methods shown in FIG. 13(a) or FIG. 13(b), according to the usage of the data processing semiconductor device, the required processing speed or the like. In addition, it may be configured so that the above-mentioned two methods can be switched by controlling the CPU 10 according to a predetermined condition.

Embodiment 4

Figure 14:
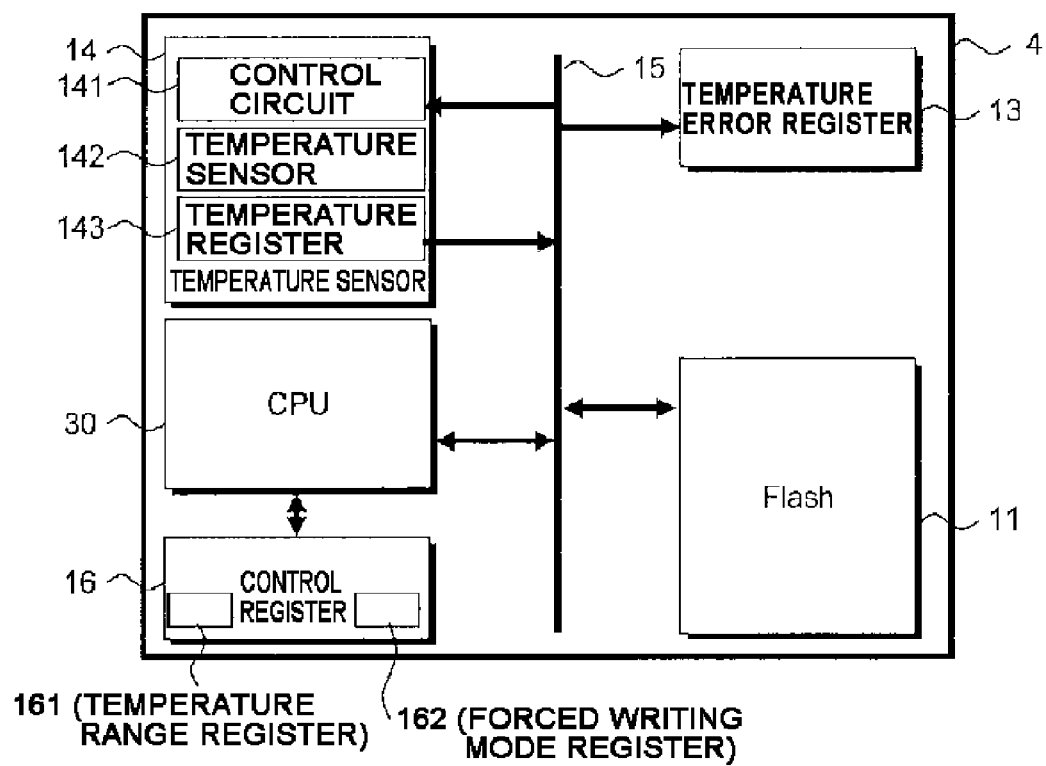
FIG. 14 is a chart illustrating a data processing semiconductor device according to an embodiment 4.

FIG. 14 is a chart illustrating a data processing semiconductor device according to another embodiment of the present invention.

Using a program executed by the CPU 10, a data processing semiconductor device 4 shown in FIG. 14 controls overwriting of data performed by the P/E sequencer 12.

In FIG. 14, identical reference numerals are provided to components that are identical to those of the data processing semiconductor device 1, with detailed description thereof being omitted.

The data processing semiconductor device 4 comprises a CPU 30 instead of the CPU 10.

In addition to the function of the CPU 10, the CPU 30 controls overwriting of data by the P/E sequencer 12, using the program.

A method of controlling overwriting of data by the CPU 30 is explained.

When overwriting data in the flash memory unit 11, the CPU 30 first sets a value defining the predetermined temperature range that permits overwriting in the temperature range register 161. In addition, the CPU 10 sets in the forced writing mode register 162 whether or not to perform the forced writing mode. Here, the settings of the temperature range register 161 and the forced writing mode register 162 may be preliminarily set at the time of power-on reset of the CPU 10.

The CPU 30 then requests measurement of temperature to the temperature sensor unit 14 and receives the temperature data.

Subsequent control of data overwriting exhibits an effect similar to that by the P/E sequencer 12 according to a similar arrangement as the P/E sequencer 12.

Accordingly, the data processing semiconductor device 3 controls overwriting of data in the flash memory unit 11 by a program executed in the CPU 30, and thus the P/E sequencer 12 becomes unnecessary and an effect similar to that of the data processing semiconductor device 1 is exhibited.

Although, in the data processing semiconductor device 4, the predetermined temperature range that permits overwriting and existence or nonexistence of the forced writing mode are set by setting the value of the register, this is not limiting and a method of preliminarily setting the value on a program may be employed.

Embodiment 5

Figure 15:
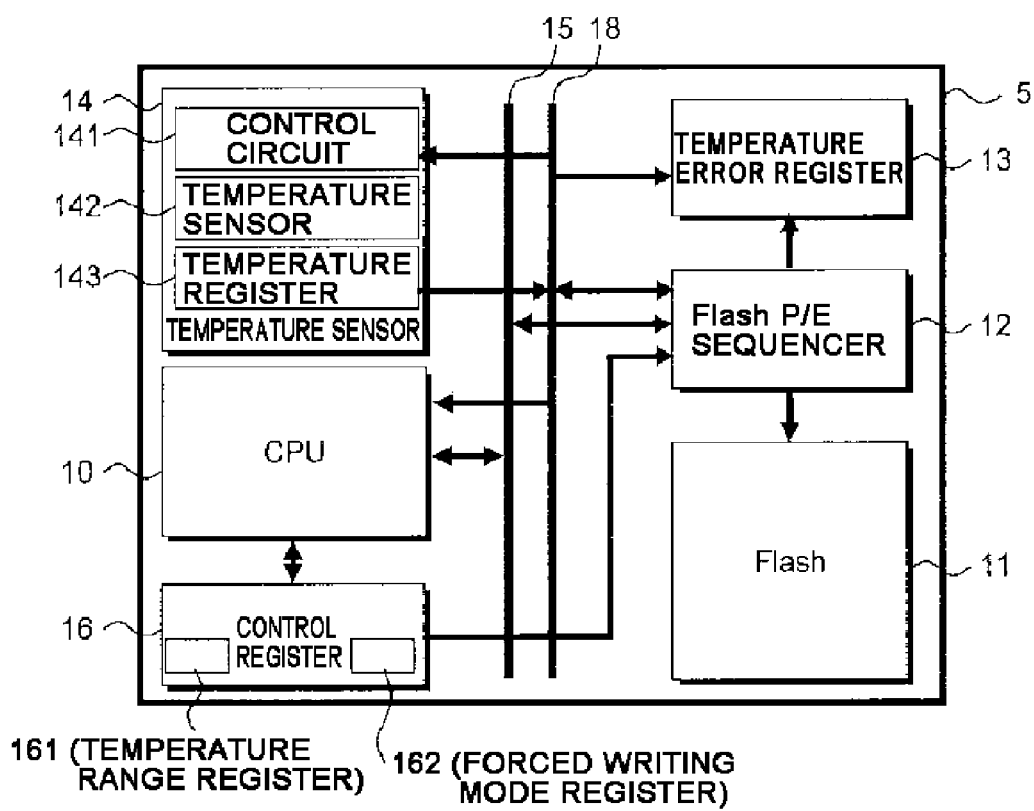
FIG. 15 is a chart illustrating a data processing semiconductor device according to an embodiment 5.

FIG. 15 is a chart illustrating a data processing semiconductor device according to another embodiment of the present invention.

A data processing semiconductor device 5 shown in FIG. 15 comprises, in addition to the components of the data processing semiconductor device 1, a dedicated temperature information bus 18 used for transmitting information relating to temperature when controlling overwriting of data in the memory area of the flash memory unit 11.

In FIG. 15, identical reference numerals are provided to components that are identical to those of the data processing semiconductor device 1, with detailed description thereof being omitted.

The dedicated temperature information bus 18 is used in the following case.

For example, when requesting measurement of temperature to the temperature sensor unit 14, the P/E sequencer 12 issues the request of the measurement via the bus 18, and the temperature sensor unit 14 that received the request outputs the temperature data to the bus 18. In addition, upon completion of overwrite operation of data, the P/E sequencer 12 notifies the CPU 10 of the fact via the bus 18.

As described above, by using the dedicated temperature information bus 18, the data processing semiconductor device 5 experiences no bus contention with other programs, and thus it becomes possible to reduce the probability that the time required for processing of data overwriting increases, and an effect similar to that of the data processing semiconductor device 1 can be exhibited.

Embodiment 6

Figure 16:
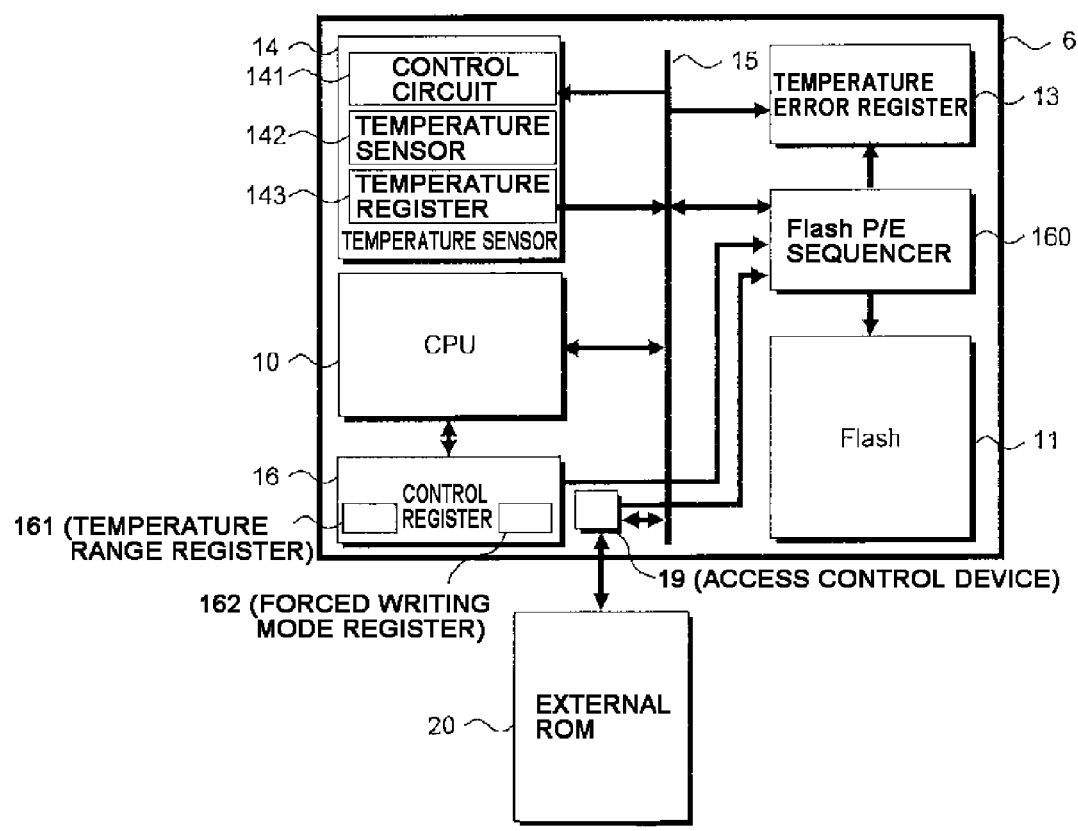
FIG. 16 is a chart illustrating a data processing semiconductor device according to an embodiment 6.

FIG. 16 is a chart illustrating a data processing semiconductor device according to another embodiment of the present invention.

A data processing semiconductor device 6 shown in FIG. 16 further comprises an access control device 19 for an external ROM, and performs a control of reading data from an external ROM 20 installed outside, in addition to the function of the data processing semiconductor device 1.

In FIG. 16, identical reference numerals are provided to components that are identical to those of the data processing semiconductor device 1, with detailed description thereof being omitted.

In addition to the function of the P/E sequencer 12, a P/E sequencer 160 performs a control of reading data in the memory area of the flash memory unit 11. In other words, when reading data in a temperature environment outside the temperature range that guarantees reading, the P/E sequencer 160 issues a data read request to the access control device 19, without reading data from the flash memory unit 11.

The access control device 19 reads desired data from the external ROM 20 according to the data read request from the P/E sequencer 160.

The control of reading data from the external ROM 20 by the P/E sequencer 160 is explained.

First, as a prerequisite, let us consider a case where data identical to data stored in the flash memory unit 11 is stored in the external ROM 20. For example, let us consider a case where data to be read from the flash memory unit 11 is data constituting a program, and data of the identical program of the data is stored in the external ROM 20.

Upon receiving from the CPU 10 the request to read data in the flash memory unit 11, the P/E sequencer 160 receives the temperature data from the temperature sensor unit 14, similarly to the case of overwriting the data, and determines whether or not the temperature indicated by the temperature data is within the temperature range that permits reading. If, as a result of the determination, the temperature is within the temperature range that permits reading, data is read from the flash memory unit 11.

On the other hand, if, as a result of the determination, the temperature is outside the temperature range that permits reading, the P/E sequencer 160 issues a data read request to the access control device 19. For example, if the temperature is higher than 175 degrees, which is outside the temperature range that guarantees reading of data shown in FIG. 4, a data read request is issued to the access control device 19.

Upon receiving the data read request, the access control device 19 reads data from the external ROM 20 according to the request and notifies the P/E sequencer 160 that the data has been read. Upon receiving the notification, the P/E sequencer 160 notifies the CPU 10 that the data has been read, and terminates the read operation.

As described above, according to the data processing semiconductor device 6, data is read from the external ROM in an environment outside the operation guarantee temperature range, and thus reliability of reading can be improved. Accordingly, when reading a program in an environment outside the operation guarantee temperature range, malfunction of the data processing semiconductor device 6 because the program is not correctly read can be prevented.

The method of controlling data reading can also be applied to the data processing semiconductor device 2. In this case, an effect similar to that of the data processing semiconductor device 6 can be exhibited by applying the method to control of reading data in the code memory area 901.

Although the invention made by the inventors has been specifically explained based on embodiments, it is needless to say that the present invention is not limited to the above embodiments and can be modified in various ways without deviating from the scope thereof.

For example, although the data processing semiconductor devices 1 to 6 perform the first operation mode, the forced writing mode, and the refresh operation when controlling data overwriting, it is not limiting and a control of data overwriting may be employed which does not perform the forced writing mode and the refresh operation.

What is claimed is:

1. A data processing semiconductor device comprising:
   nonvolatile memory unit having a rewritable nonvolatile memory area; and
   a control unit which controls reading, writing, or erasing of data in the memory area,
   wherein the control unit has a first operation mode which, referring to input temperature data, controls a temperature range for writing or erasing data to be narrower than a temperature range that allows reading of data in the memory area.

2. The data processing semiconductor device according to claim 1,
   wherein the control unit writes or erases data in a second operation mode if the input temperature data indicates a temperature outside the temperature range for writing or erasing data in the first operation mode, and generates predetermined information for distinguishing the data from the data written or erased in the first operation mode.

3. The data processing semiconductor device according to claim 2,
   wherein the control unit reads data written in the second operation mode based on the predetermined information, and writes the read-out data in the first operation mode.

4. The data processing semiconductor device according to claim 3,
   wherein the memory area has a first memory area for writing or erasing data in the first operation mode and a second memory area for writing or erasing data in the second operation mode, and
   wherein the control unit, upon writing or erasing in the second memory area in the second operation mode, generates information associating the address of the second memory area in which the writing or erasing has been performed with the address of the first memory area specified by a request of the writing or erasing, as the predetermined information.

5. The data processing semiconductor device according to claim 3,
   wherein the control unit, using the predetermined information as predetermined flag information in the second operation mode, adds the flag information to the data to be written in the second operation mode.

6. The data processing semiconductor device according to claim 3, further comprising
   a temperature sensor unit which measures temperature and generates data of the measured temperature,
   wherein the control unit receives the generated temperature data.

7. The data processing semiconductor device according to claim 1,
   wherein the first operation mode sets the upper limit of the temperature range for writing or erasing data to be lower than the upper limit of the temperature range that guarantees reading of data.

8. The data processing semiconductor device according to claim 1,
   wherein the first operation mode sets the lower limit of the temperature range for writing or erasing data to be higher than the lower limit of the temperature range that guarantees reading of data.

9. The data processing semiconductor device according to claim 1,
   wherein the control unit generates information indicating an error without writing or erasing data in the memory area, if the temperature measured in the first operation mode is outside the temperature range for writing or erasing data.

10. The data processing semiconductor device according to claim 9,
    wherein the information indicating an error includes information indicating that writing or erasing of data has not been performed.

11. The data processing semiconductor device according to claim 1,
    wherein the memory area has a third memory area for storing data constituting a program and a fourth memory area for storing data, and
    wherein the control unit controls the temperature range for writing or erasing data in the third memory area in the first operation mode to be narrower than the temperature range for writing or erasing data in the fourth memory area.

12. The data processing semiconductor device according to claim 11,
    wherein if the input temperature data indicates a temperature outside a predetermined temperature range, the control unit performs a control of reading data corresponding to the data stored in the third memory area from an external storage device when reading data in the third memory area.

13. The data processing semiconductor device according to claim 1,
    wherein the control unit refers to the input temperature data for each operational unit of a predetermined operation when writing or erasing data.

14. A data processing semiconductor device comprising:
    a nonvolatile memory unit having a rewritable nonvolatile memory area; and
    a control unit which controls reading, writing, or erasing of data in the memory area,
    wherein the control unit has a first operation mode which, referring to input temperature data, controls a temperature range that guarantees writing or erasing of data to be narrower than a temperature range that guarantees reading of data in the memory area.

15. The data processing semiconductor device according to claim 14,
    wherein the control unit writes or erases data in a second operation mode if the input temperature data indicates a temperature outside a temperature range for writing or erasing data in the first operation mode, and generates predetermined information for distinguishing the data from the data written or erased in the first operation mode.

16. The data processing semiconductor device according to claim 15, wherein the control unit reads, based on the predetermined information, the data written in the second operation mode, and writes the read-out data in the first operation mode.

17. The data processing semiconductor device according to claim 14, wherein the memory area has a third memory area for storing a program for program control and a fourth memory area for storing data, and wherein the control unit controls, in the first operation mode, the temperature range that guarantees writing or erasing of data in the third memory area to be narrower than the temperature range that guarantees writing or erasing of data in the fourth memory area.

18. The data processing semiconductor device according to claim 14, wherein the temperature range that guarantees reading of data is equal to the temperature range guaranteed in the entire semiconductor device.

* * * * *